Figure 1:
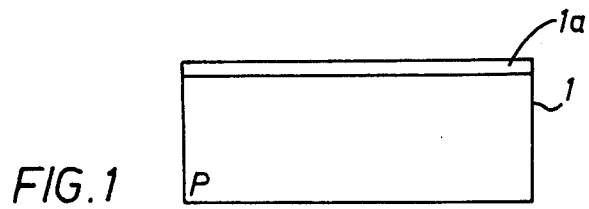

United States Patent [19]

Cohen-Solal et al.

[11] 3,988,774

[45] Oct. 26, 1976

[54] PROCESS FOR PRODUCING A PHOTODIODE SENSITIVE TO INFRARED RADIATION

[75] Inventors: Gérard David Cohen-Solal, Paris; Alain Gilles Lussereau, Saint-Michel-sur-Orge, both of France

[73] Assignee: Societe Anonyme de Telecommunications, France

[22] Filed: Apr. 28, 1975

[21] Appl. No.: 572,225

[30] Foreign Application Priority Data

Aug. 6, 1974   France ............................ 74.27282

[52] U.S. Cl. .................................. 357/30; 29/572; 148/175; 148/187; 156/600; 204/192; 357/58; 357/61
[51] Int. Cl.² .................... H01L 31/00; H01L 21/36
[58] Field of Search .......... 156/613, 614, 610, 600; 427/93, 87, 86, 126; 204/192, 192 OP; 357/30, 58, 61; 29/578, 589, 572; 148/175, 187

[56] References Cited

UNITED STATES PATENTS

| | | | |
|---|---|---|---|
| 3,576,478 | 4/1971 | Watkins | 148/175 |
| 3,753,805 | 8/1973 | Meer | 148/187 |

*Primary Examiner*—Cameron K. Weiffenbach

[57] ABSTRACT

A process for producing a photodiode sensitive to infrared radiation, obtained by the planar technique, constituted by a semiconducting material comprising a substrate of type $p$ (or $n$) and a zone of type $n$ (or $p$) forming the junction, wherein a thin layer is deposited on the substrate surface by a per se known process, the said thin layer being constituted by a compound whose constituents are taken from among those of the substrate, whereby the proportions thereof are the same or close to those of the said substrate, a dielectric protective layer is deposited on the said thin layer, the material thus obtained is thermally treated, a diffusion of the zone of the other type is effected in order to form the junction and local deposits of metal are made on the surface of the said dielectric layer.

6 Claims, 5 Drawing Figures

PROCESS FOR PRODUCING A PHOTODIODE SENSITIVE TO INFRARED RADIATION

The present invention relates to a process for the production of a photodiode which is sensitive to infrared radiation obtained by the planar technique.

Photovoltaic detectors of infrared radiation having a junction are already known. They substantially comprise a semiconductor wafer having two zones of different types, namely a zone of type $p$ and a zone of type $n$. Each of these zones has an output connection. The presence of infrared radiation striking against the face of one of these two zones creates between the two electrodes in open circuit a potential difference which is dependent on the infrared radiation intensity and the detector quality.

The semiconducting material chosen can be a crystal, such as Hg Cd Te, as described in French Pat. No. 1,504,497.

One of the techniques which makes it possible to industrially produce such detectors having one or more elements, as well as opto-electronic circuits in the field of infrared detection is the planar technique. The mesa technique involving a relief structure, unlike the planar technique is unsuitable for the use of integration techniques.

According to the planar technique, a thin masking layer is deposited by evaporation or sputtering on a substrate, for example Hg Cd Te of predetermined type $p$ (or $n$). This layer has the following characteristics: it is impermeable to doping agents (mercury, indium, copper, etc.), it is an electrical insulant, it is chemically inert and finally has adequate mechanical properties to enable it to resist the various treatments involved in manufacture, e.g. photogravure, thermal treatment, etc.

The various dielectric materials $SiO_2$, $SiO$, $Si_3N_4$ currently used in the semiconductor industry, as well as SnS partly meet these requirements.

A doping agent is then diffused into the openings made within the masking layer, using a technique such as photogravure so that $n$ (or $p$) zones are made on the substrate surface. These zones are separated by the substrate of the opposite type. However, this immediate passivation prevents any subsequent action with the aim of improving the electrical characteristics of the diode. One of these parameters, such as the shunt resistance largely depends on the surface states of the material at the level of the transition zone of $n$ and $p$. The physical and chemical nature of the masking layer, as well as the physical nature of the interface between this masking layer and the semiconductor determine the quality of the diode.

The various dielectric materials mentioned hereinbefore do not make it possible to obtain high shunt impedances. In actual fact on the one hand, stresses on the surface of the material modify the surface conduction and on the other an abrupt interface between the materials having very different physical characteristics produces a conduction type change or inversion area.

The object of the present invention is to obviate these disadvantages in known photodiodes. It makes it possible to improve the electrical characteristics even prior to creating the junction and is compatible with the planar technique. The photodiode according to the invention eliminates the disadvantages mentioned hereinbefore by placing a thin transition layer between the substrate and the dielectric masking layer necessary for local diffusion. The physical and chemical properties of the transition layer give the process and apparatus numerous advantages which can be gathered from the following description.

Figure 2:
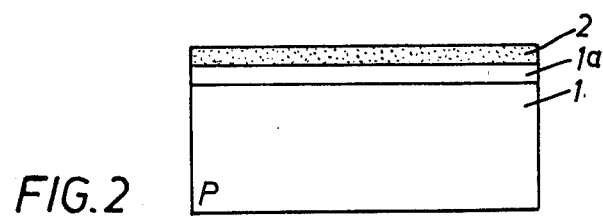
Figure 3:
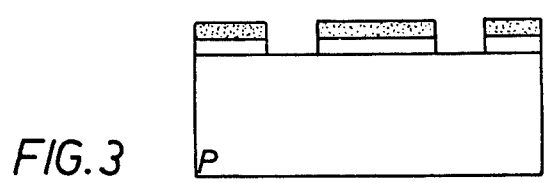
Figure 4:
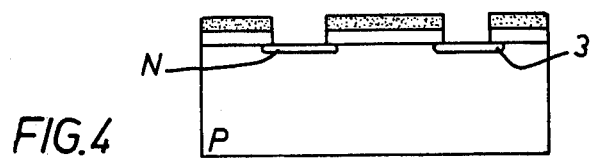
Figure 5:
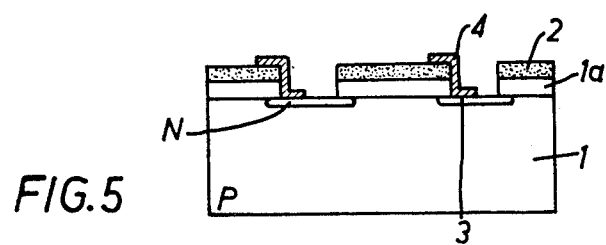

The attached drawings will facilitate comprehension of the description. In the drawings:

FIGS. 1 to 5 show schematically the photodiode during the different operating phases of the process according to the invention.

As a non-limitative example, the semiconducting material used is Hg Cd Te which is particularly well-suited to the detection of infrared radiation. However, the invention also extends to other compounds used for infrared detection, whereby the same physical discordance problem between interface and dielectric material reoccurs and can be solved by the same process.

The thin layer deposited in accordance with the invention has the following physical characteristics: it is an electrical insulant, it has an expansion factor close to that of the substrate and its crystal lattice is very close to that of the substrate.

A certain number of semiconductor materials satisfy this criterion. When the substrate is a solid solution of several materials, a thin intermediate layer can be made from a compound whose constituents are the same as those of the substrate, whereby the proportions used are identical or close to those of the substrate.

For example, in the case of the Hg Cd Te material, the intermediate layer according to the invention is formed from an Hg Cd Te layer having a mercury concentration equal to or below that of the substrate or zero.

The following table shows the concordance of the physical characteristics of the layers, extracted from "Infra-Red Detectors" (Williardson and Beer 1970).

| | Pitch of crystal Lattice | Thermal Expansion coefficient |
|---|---|---|
| Hg Cd Te | 6.464 A | $4.3 \times 10^{-6}/°C$ |
| Cd Te | 6.481 A | $5.5 \times 10^{-6}/°C$ |

According to the invention, the photodiode is produced in the following way:

1 - A thin intermediate layer 1a is deposited on substrate 1 of type $p$ (or $n$) by cathodic sputtering, epitaxy, evaporation or any other per se known process (FIG. 1).
2 - A second dielectric layer 2 (FIG. 2) impermeable to the doping agents of the substrate and chemically inert, e.g. SiO, $SiO_2$, ZnS is deposited by cathodic sputtering or any other known process.
3 - Heat treatment is performed in such a way as to bring about diffusion between thin layer 1a which recrystallizes and the substrate.
4 - The windows are opened by the known planar technique (FIG. 3).
5 - Doped areas 3 of type $n$ (or $p$) are formed by diffusion through openings made in the two layers 1a and 2 (FIG. 4).
6 - Metallisation 4 is carried out over a small part of the insulating layer to obtain electrical contacts by depositing a thin layer of chromium or gold.

The heat treatment makes it possible to obtain a layer 1a of gradual composition. Between the substrate and the first layer which recrystallizes, a layer is formed having intermediate physical characteristics and a high electrical resistance. As the p-n junction is located in this area, the indicated technique eliminates the inverse currents of the photodiode and a long-term stability of the thermal characteristics is obtained.

Obviously, the present invention is not limited to the case of the Hg Cd Te crystal of the *p* (or *n*) type. This problem of the interface between the substrate and the dielectric material occurs whenever there is discordance between the physical characteristics of the material and the protective coating. Therefore, the object of the present technique is to eliminate this problem.

It makes it possible to use the planar technique appropriate for integrated circuits and provides an immediate and prolonged protection of the surface of the junction during its formation.

What we claim is:

1. A process for producing a photodiode responsive to infrared radiation, which comprises the steps of depositing a thin layer over a p- or n- substrate of semiconductor material, said thin layer being of an electrically insulating material having a coefficient of expansion, a crystal lattice and a composition close to that of said semiconductor material, and the compositions of said semiconductor and said thin layer being the same or closely similar in proportions, depositing a dielectric protective layer over said thin layer, thermally treating the resulting product to bring about diffusion between said thin layer and said substrate, forming openings in said dielectric layer and said thin layer by planar technique, forming doped areas of opposite conductivity to the substrate through said openings to create a p-n junction and metallizing a part of the insulating material with electrically conducting metal.

2. A production process according to claim 1, wherein said thin layer is deposited by cathodic sputtering.

3. A production process according to claim 1, wherein the said thin layer is deposited by epitaxial growth.

4. A production process according to claim 1, wherein the said thin layer is deposited by evaporation under vacuum.

5. A production process according to claim 1, wherein said semiconductor material is composed of Hg Cd Te and said thin layer is composed of Cd Te.

6. A photodiode responsive to infrared radiation produced by the process of claim 1.

* * * * *